(12) United States Patent
McMullin

(10) Patent No.: US 6,329,811 B1
(45) Date of Patent: Dec. 11, 2001

(54) CALIBRATION UNIT FOR SEMICONDUCTOR INTEGRATED CIRCUIT TESTER

(75) Inventor: Jeffrey S. McMullin, Portland, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/493,519

(22) Filed: Jan. 28, 2000

(51) Int. Cl.[7] ........................................ G01R 1/04
(52) U.S. Cl. ............................................. 324/158.1
(58) Field of Search ..................... 324/754, 158.1; 901/27, 28, 29

(56) References Cited

U.S. PATENT DOCUMENTS

| 6,106,511 | * | 8/2000 | Jensen | .................................. | 606/1 |
| 6,124,723 | * | 9/2000 | Costello | .......................... | 324/762 |

* cited by examiner

*Primary Examiner*—Safet Metjahic
*Assistant Examiner*—Etienne LeRoux
(74) *Attorney, Agent, or Firm*—John Smith-Hill; Smith-Hill and Bedell

(57) ABSTRACT

A calibration unit for a semiconductor integrated circuit tester includes a frame, a manipulator arm which extends in cantilever fashion from the frame, and a calibration head attached to the manipulator arm at its distal end and having a downwardly directed test interface for mating with a test head in DUT up orientation.

11 Claims, 2 Drawing Sheets

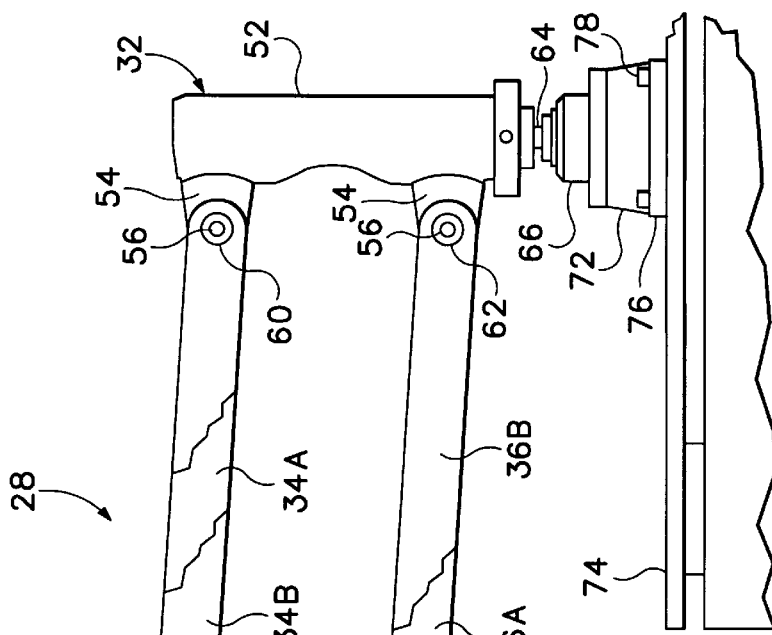
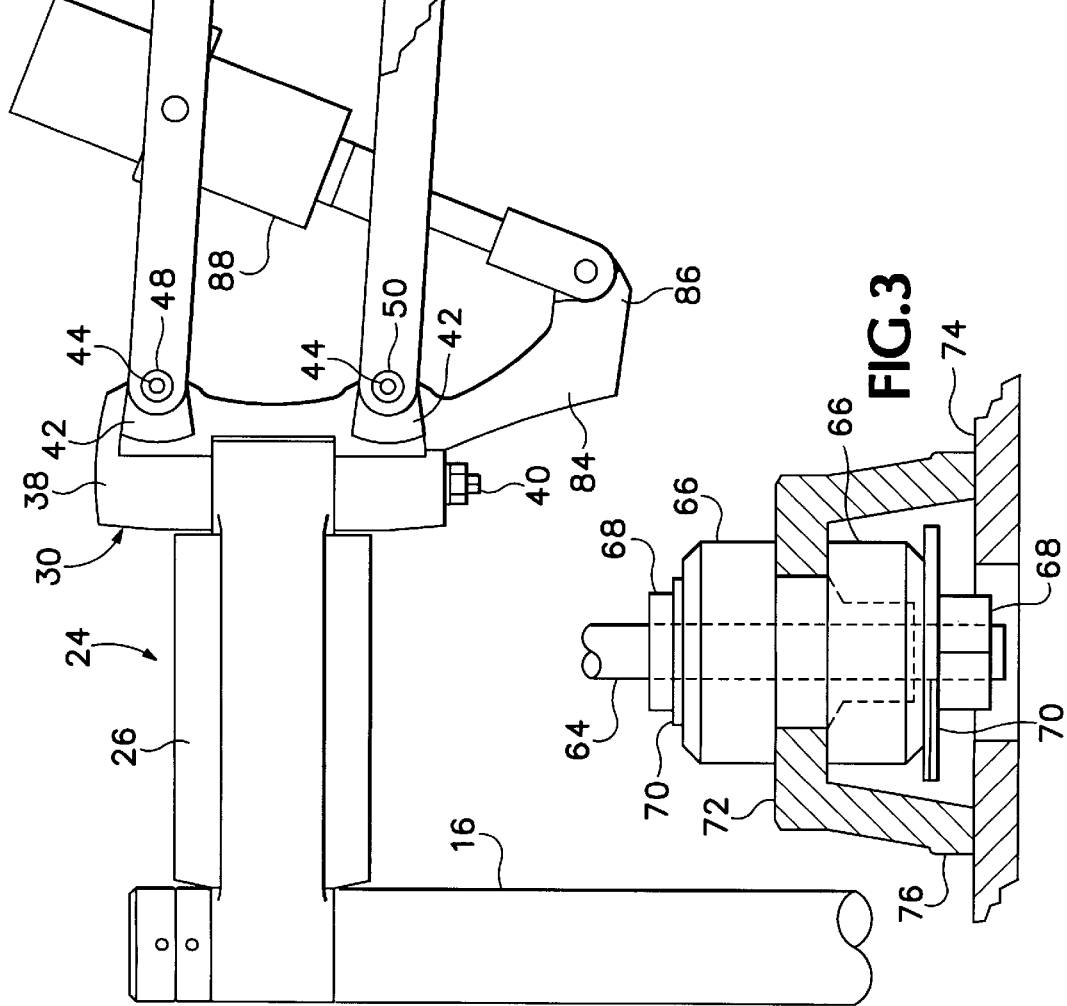

CALIBRATION UNIT FOR SEMICONDUCTOR INTEGRATED CIRCUIT TESTER

BACKGROUND OF THE INVENTION

This invention relates to a calibration unit for a semiconductor integrated circuit tester.

A conventional semiconductor integrated circuit tester includes a test head having multiple terminals for engaging respective terminals of a device under test (DUT) for carrying out test activities at the terminals of the DUT. The terminals of the test head are distributed over a DUT interface of the test head. The test head is conventionally carried by a manipulator which allows the test head to be positioned in several different orientations, including the so-called DUT down orientation in which the DUT interface is directed downwards, for engaging a DUT from above.

U.S. Pat. No. 4,724,378 discloses a calibration unit for a semiconductor integrated circuit tester. A practical implementation of the calibration unit shown in U.S. Pat. No. 4,724,378 includes a wheeled trolley or cart having a frame and an XYZ table mounted to the frame in a manner allowing movement of the table relative to the frame along horizontal (X and Y) and vertical (Z) axes. The test head of the tester that is to be calibrated is positioned over the calibration unit in the DUT down orientation and is docked to the calibration unit. The XYZ table executes a sequence of movements relative to the frame of the trolley to engage sequentially each terminal of the test head. While the XYZ table is in engagement with a given terminal, the calibration unit and the tester execute a calibration operation.

The practical implementation of the known calibration unit can only operate with a tester whose test head can be positioned in the DUT down orientation. This is not a severe disadvantage with a tester having a manipulator that provides a full range of movement of the test head. However, it has been proposed that semiconductor integrated circuit testers should be designed so that the test head has a limited range of movement and cannot be positioned in the DUT down orientation, even though it can be positioned in the DUT up orientation, in which the DUT interface is directed downwards. The conventional calibration unit cannot be used to calibrate such testers.

SUMMARY OF THE INVENTION

In accordance with a first aspect of the invention there is provided a calibration unit for a semiconductor integrated circuit tester comprising a frame, a manipulator arm having a proximal end at which it is attached to the frame and extends in cantilever fashion from the frame, the manipulator arm also having a distal end, and a calibration head attached to the manipulator arm at the distal end thereof and having a downwardly directed test interface for mating with a test head in DUT up orientation.

In accordance with a second aspect of the invention there is provided a semiconductor integrated circuit tester including a frame, a manipulator arm having a proximal end at which it is attached to the frame and extends in cantilever fashion from the frame, the manipulator arm also having a distal end, and a test head attached to the manipulator arm at the distal end thereof and having a downwardly directed test interface, and wherein the manipulator arm includes a parallelogram linkage allowing vertical movement of the test head relative to the frame.

BRIEF DESCRIPTION OF THE DRAWINGS

For a better understanding of the invention, and to show how the same may be carried into effect, reference will now be made, by way of example, to the accompanying drawings, in which FIG. 2 is a side view at an enlarged scale of a part of the calibration unit shown in FIG. 1, and FIG. 3 is an enlarged sectional view of a detail of FIG. 2.

DETAILED DESCRIPTION

Figure 1:
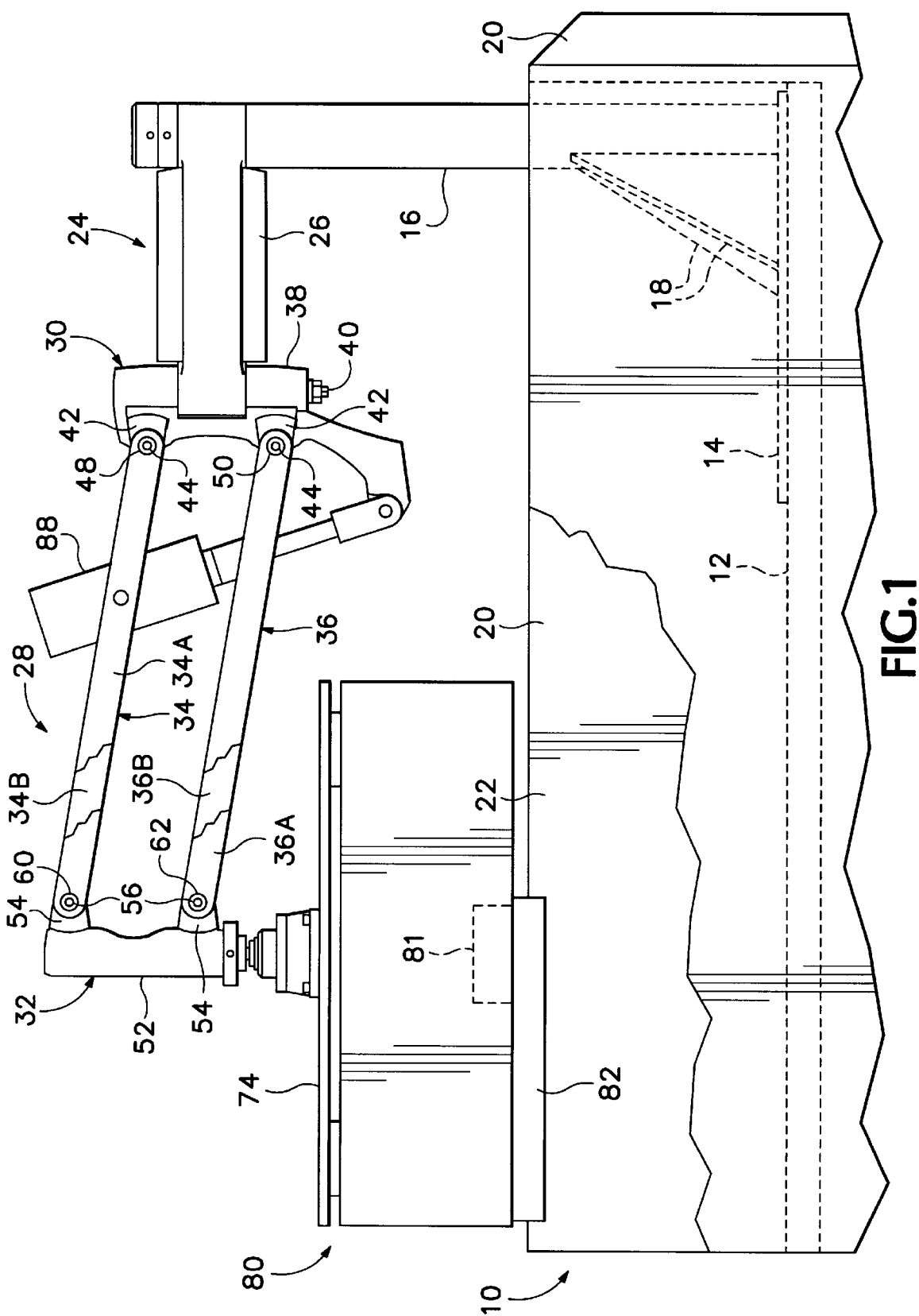
FIG. 1 is a perspective view of a calibration unit in accordance with the invention.

The calibration unit shown in FIG. 1 comprises a wheeled cart 10 including a rectangular frame 12 to which a support plate 14 is attached. A post 16 extends upward from the support plate 14 at one end of the cart. The post is held in a vertical orientation by gusset plates 18, which are welded to the post and to the support plate 14. Vertical side plates 20 attached to three of the sides of the frame extend upward, above the support plate 14 and define a storage compartment 22.

A manipulator arm 24 is attached to the upper end of the post 16. The manipulator arm 24 includes an inner arm segment 26 which is supported on the post 16 by a bearing which constrains the inner arm segment to extend substantially radially from the post 16 and allows the inner arm segment 26 to pivot relative to the post 16 about a vertical axis.

The manipulator arm also includes an outer arm assembly 28 formed as a parallelogram linkage composed of inner and outer vertical links 30, 32 and upper and lower links 34, 36 which connect the vertical links. The inner vertical link 30 includes a body 38 in which a shaft 40, only the lower end of which can be seen in the drawings, is held. The shaft 40 is journalled in a bearing which is housed in the outer end of the inner arm segment 26 and constrains the shaft to a vertical orientation. Suitable thrust bearings (not shown) support the body 38 relative to the inner arm segment 26 and allow the vertical link 30, and the parallelogram linkage of which the vertical link 30 is a part, to pivot relative to the arm segment 26 about the axis of the vertical shaft 40.

The upper link 34 is composed of two parallel rods 34A, 34B. Similarly, the lower link 36 is composed of two parallel rods 36A, 36B.

Two vertically-spaced ears 42 project from the body 38 and horizontal shafts 44 pass through the ears and project at each end from the ears 42. The inner ends of the upper rods 34A, 34B are journalled on the projecting ends of the upper shaft by bearings 48 and the inner ends of the lower rods 36A, 36B are journalled on the projecting ends of the lower shaft by bearings 50.

The outer vertical link 32 includes a body 52 from which two vertically-spaced ears 54 project. As in the case of the inner link 30, horizontal shafts 56 pass through the ears 54 and project at each end from the ears. The outer ends of the upper rods 34A, 34B are journalled on the projecting ends of the upper shaft by bearings 60 and the outer ends of the lower rods 36A, 36B are journalled on the projecting ends of the lower shaft by bearings 62.

As shown in FIG. 2, body 52 accommodates a shaft 64, the lower end of which projects downwards from the body 52. The shaft 64 is journalled in a bearing which constrains the shaft 64 to a vertical orientation and allows rotational movement of the shaft 64 relative to the body 52. Suitable bearings retain the shaft 64 in the body 52.

As shown in FIG. 3, the shaft 64 is provided at its lower end with a two-part bushing 66 which is made of rubber or other resiliently deformable material and is held on the shaft 64 by nuts 68 and washers 70. A mounting element 72 is attached to the shaft 64 by the bushing 66. Specifically, the mounting element 72 is composed of an annular disk portion and a skirt depending from the rim of the disk portion, and the shaft 64 passes through the hole in the annular disk portion and the annular disk portion is clamped between the two parts of the bushing 66. The skirt has an external flange 76 and a carrier plate 74 is secured to the flange 76 by screws 78 (FIG. 2).

The carrier plate 74 is nominally horizontal, but the deformable bushing 66 allows a limited range of angular movement of the carrier plate 74 relative to the outer arm assembly 28 about horizontal axes. A calibration head 80 including an XYZ table 81 is attached to the underside of the plate 74 and is oriented with its test interface downwards. The calibration head 80 includes docking bars 82 for docking to a test head in DUT up orientation.

When the calibration unit is not in use, the manipulator arm can be turned about the post 16 to position the calibration head over the storage compartment 22 and the calibration head can then be lowered so that the docking bars 82 are positioned in the storage compartment. In this condition, the test interface is protected effectively from damage by inadvertent impacts.

A leg 84 extends downward from the inner body 30 and is provided at its lower end with a foot 86. A linear actuator 88 is attached at one end to the foot 86 and extends upward from the foot 86, passing between the lower rods 36A, 36B and between the upper rods 34A, 34B, and is attached to the upper rods 34A, 34B. The linear actuator may be, for example, a gas cylinder or a compressed air cylinder connected to a regulated source of compressed air. By virtue of its connection between the inner body 30 and the upper rods 34A, 34B, the linear actuator is able to exert a force resisting the force exerted on the outer body 32 by the weight of the carrier plate 74 and the calibration head 80. Accordingly, even though the weight of the calibration head might be as much as 250 kg, an operator can easily raise and lower the carrier plate 74 and the calibration head using one hand, and can position the calibration head precisely over the test head prior to docking with the test head.

The pivotal connections of the inner arm segment 24 allow a wide range of horizontal movement of the calibration head without influencing the vertical position of the calibration head, and the parallelogram linkage allows vertical movement of the calibration head without influencing the orientation of the carrier plate 74. The mounting of the calibration head to the outer link 32 allows the calibration head to turn about a vertical axis and allows limited angular movement of the calibration head about horizontal axes.

When the calibration unit is not in use, the manipulator arm can be turned about the post 16 to position the calibration head over the storage compartment 22 and the calibration head can then be lowered so that the docking bars 82 are positioned in the storage compartment. In this condition, the tester interface is protected effectively from damage by inadvertent impacts.

It will be appreciated that the invention is not restricted to the particular embodiment that has been described, and that variations may be made therein without departing from the scope of the invention as defined in the appended claims and equivalents thereof. For example, although the invention has been described with reference to a calibration unit to be used with a tester having a test head which can be positioned in the DUT up orientation but not in the DUT down orientation, the invention can also be used to provide a semiconductor integrated circuit tester having a test head which can be positioned only in the DUT down orientation. In this case, the element 80 shown in FIG. 1 is the test head of a tester rather than the calibration head of a calibration unit and the test head can be used in conjunction with a device handler or wafer prober that can present devices to be tested to a test head in DUT down orientation. A manipulator that provides a limited range of movement for the test head is advantageous because it is less expensive to manufacture than a conventional manipulator that not only allows the test head to be moved vertically and horizontally but also allows the test head to be positioned selectively in the DUT up orientation or in the DUT down orientation.

What is claimed is:

1. A calibration unit for a semiconductor integrated circuit tester comprising:
    a frame;
    a manipulator arm having a proximal end at which it is attached to the frame and extends in cantilever fashion from the frame, the manipulator arm also having a distal end; and
    a calibration head attached to the manipulator arm at the distal end thereof and having a downwardly directed test interface for mating with a test head in DUT up orientation, the calibration head including a mechanism for docking to the test head.

2. A calibration unit according to claim 1, wherein the calibration head also includes a translation table for allowing sequential engagement with terminals of the test head.

3. A calibration unit in accordance with claim 1, wherein the frame is provided with wheels allowing movement of the frame.

4. A calibration unit in accordance with claim 1, wherein the frame defines a storage compartment for receiving the calibration head.

5. A calibration unit for a semiconductor integrated circuit tester comprising:
    a frame;
    a calibration head having a test interface for mating with a test head; and
    a manipulator arm having a proximal end at which it is attached to the frame and extends in cantilever fashion from the frame, the manipulator arm also having a distal end at which it is attached to the calibration head and supports the calibration head with the test interface directed downwards for mating with the test head in DUT up orientation, the manipulator arm including a parallelogram linkage allowing vertical movement of the calibration head relative to the frame,
    wherein the parallelogram linkage has an inner end which is restrained against vertical movement and an outer end to which the calibration head is attached, and
    wherein the manipulator arm further includes a force element effective between the inner end of the parallelogram linkage and the outer end thereof for counterbalancing the calibration head.

6. A calibration unit in accordance with claim 5, wherein the parallelogram linkage includes an upper link member linking the inner end of the parallelogram linkage to the outer end thereof and a lower link member linking the inner end of the parallelogram linkage to the outer end thereof and spaced vertically below said upper link member, said force element acting between the inner end of the parallelogram linkage and one of said link members at a location spaced from the inner end of the parallelogram linkage for urging the outer end upward relative to the inner end.

7. A semiconductor integrated circuit tester including:
a frame,
a test head including a test interface; and
a manipulator arm having a proximal end at which it is attached to the frame and extends in cantilever fashion from the frame, the manipulator arm also having a distal end at which it is attached to the test head and supports the test head with the test interface directed downwards for mating with apparatus for delivering devices for testing, the manipulator arm including a parallelogram linkage allowing vertical movement of the test head relative to the frame,
wherein the parallelogram linkage has an inner end which is restrained against vertical movement and an outer end to which the test head is attached, and
wherein the manipulator arm further includes a force element effective between the inner end of the parallelogram linkage and the outer end thereof for counterbalancing the test head.

8. A tester in accordance with claim 7, wherein the parallelogram linkage includes an upper link member linking the inner end of the parallelogram linkage to the outer end thereof and a lower link member linking the inner end of the parallelogram linkage to the outer end thereof and spaced vertically below said upper link member, said force element acting between the inner end of the parallelogram linkage and one of said link members at a location spaced from the inner end of the parallelogram linkage for urging the outer end upward relative to the inner end.

9. A tester in accordance with claim 7, including a post extending upward from the frame and wherein the manipulator arm is attached to the post.

10. A tester in accordance with claim 7, wherein the frame is provided with wheels allowing movement of the frame.

11. A tester in accordance with claim 7, wherein the frame defines a storage compartment for receiving the test head.

* * * * *